(12) United States Patent
Mishima et al.

(10) Patent No.: US 6,638,411 B1
(45) Date of Patent: Oct. 28, 2003

(54) METHOD AND APPARATUS FOR PLATING SUBSTRATE WITH COPPER

(75) Inventors: Koji Mishima, Fujisawa (JP); Mizuki Nagai, Fujisawa (JP); Ryoichi Kimizuka, Tokyo (JP); Tetsuo Matsuda, Gunma-ken (JP); Hisashi Kaneko, Fujisawa (JP)

(73) Assignees: Ebara Corporation, Tokyo (JP); Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 09/492,138

(22) Filed: Jan. 27, 2000

(30) Foreign Application Priority Data

Jan. 26, 1999 (JP) ............................... 11/017208
Apr. 1, 1999 (JP) ............................... 11/094943

(51) Int. Cl.⁷ ................................. C25D 5/34
(52) U.S. Cl. ................. 205/210; 118/73; 204/227; 205/123; 205/215; 205/223; 205/296; 205/917; 427/304; 427/305
(58) Field of Search ................ 205/123, 157, 205/210, 215, 216, 217, 223, 296, 297, 298, 917, 183, 188; 427/299, 301, 304, 404, 305; 118/73; 204/227

(56) References Cited

U.S. PATENT DOCUMENTS 2,903,403 A    9/1959  Strauss
3,328,273 A  * 6/1967  Creutz et al. ................ 204/52
4,430,173 A    2/1984  Boudot et al.
5,972,192 A  * 10/1999 Dubin et al. ................ 205/101

FOREIGN PATENT DOCUMENTS

EP           0677599 A1   10/1995

OTHER PUBLICATIONS

Frederick A. Lowenheim, *Electroplating*, McGraw–Hill Book Co., New York, pp. 99, 1978.*
F.A. Lowenheim, *Electroplating*, McGraw Hill Book Co., New York, pp 67–69, 74–75, 106–107, 198–201, 274–275, 1978.*
Patent Abstracts of Japan, vol. 017, No. 079 (C–1027), Feb. 17, 1993 & JP 04 280993A (Electroplating Eng of Japan C0.), Oct. 6, 1992.
Database WPI, Section Ch, Week 199747, Derwnet Publications Ltd., London, GB; Class L03, AN 1997–509351, XP002151467 & JP 09 241896 A (Kontex KK), Sep. 16, 1997.

* cited by examiner

*Primary Examiner*—Roy King
*Assistant Examiner*—William T. Leader
(74) *Attorney, Agent, or Firm*—Wenderoth, Lind & Ponack, L.L.P.

(57) ABSTRACT

The present invention relates to a method and apparatus for separating out metal copper according to an electroplating of copper using, for example, a solution of copper sulfate to produce copper interconnections on a surface of a substrate. The substrate is brought into contact, at least once, with a processing solution containing at least one of organic substance and sulfur compound which are contained in a plating solution. Thereafter, the substrate is brought into contact with the plating solution to plate the substrate.

13 Claims, 3 Drawing Sheets

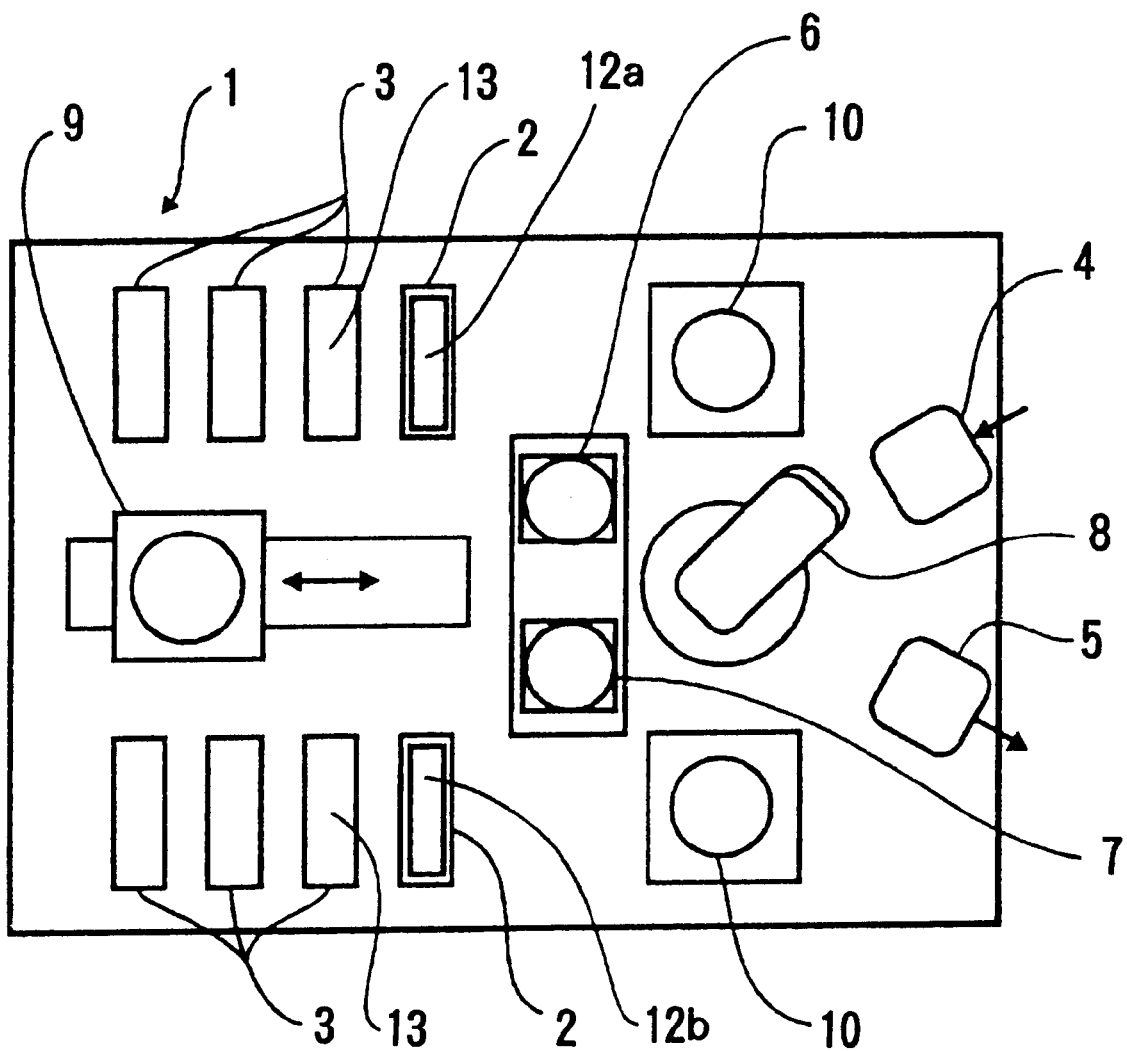
F I G. 1

METHOD AND APPARATUS FOR PLATING SUBSTRATE WITH COPPER

BACKGROUND OF THE INVENTION

1. Field of the Invention

The present invention relates to a method and apparatus for separating out metal copper according to an electroplating of copper using, for example, a solution of copper sulfate in order to fill copper in fine interconnection grooves formed in a surface of a substrate such as a semiconductor wafer to produce copper interconnections on the surface of the substrate.

2. Description of the Related Art

According to a conventional electroplating for plating a substrate with copper using a solution of copper sulfate, a substrate is dipped in sulfuric acid or the like so as to be activated by the acid in a pre-treatment process outside of a plating tank. Instead of such pre-treatment process, a substrate having a seed copper layer as an electrically conductive layer may be brought into contact with a solution of copper sulfate in the plating tank. A thin surface Cu layer etching without electrical current loading (de-energization) can be made for a certain period of time (activating time) in a pre-treatment process. Then, an electric current is supplied to separate out metal copper on the substrate after the pre-treatment process.

The former pre-treatment process is disadvantageous in that a tank different from the plating tank is necessary to carry out the pre-treatment process. Hence, the required facility is large and the running cost is increased.

On the other hand, the latter pre-treatment process is disadvantageous in that the plating solution and the seed copper layer on the substrate are not brought into contact with each other under constant conditions. Hence, additives such as a copper separation accelerator and a copper separation inhibitor contained in the plating solution tend to suffer initial adsorption irregularities to the surface of the seed copper layer and activation irregularities thereof. Further, the substrate is susceptible to the specific adsorption of a component caused by a black film on a soluble anode positioned in confronting relation to the substrate. As a consequence, the metal copper is abnormally separated out locally on the surface of the substrate, causing the substrate to have a stained appearance. When the metal copper is nonuniformly and abnormally separated out locally, the crystal orientation of the copper and the thickness of the copper layer become irregular, making it difficult for the substrate to be polished to a flat finish by a chemical mechanical polishing (CMP) process after the plating process.

According to conventional solutions to the above problems, the activating time is increased, or the substrate is rotated or the plating solution is stirred by a device known as a squeegee, whereby adsorption irregularities and activation irregularities are eliminated. However, the activating process carried out for a long period of time tends to dissolve away the seed copper layer in its entirety because the seed copper layer provided as a fine interconnection pattern or a very thin electrode layer on the bottom of holes having a high aspect ratio is etched more than other portions, possibly making it impossible to embed metal copper according to electroplating. The other solutions referred to above are disadvantageous in that they make the entire system complex or large in size.

Further, the conventional copper plating process is problematic in that the thickness of the deposited copper film differs from location to location because of the presence of the interconnection pattern. According to this problem, specifically, the thickness of the deposited copper film is much larger in an area where fine interconnections are closely spaced than in an area which is free of fine interconnections. The hump, which is the difference between the thickness of the deposited copper film in the area where fine interconnections are closely spaced and the thickness of the deposited copper film in the area free of fine interconnections, may reach 1 $\mu$m. The hump presents difficulty in polishing the deposited copper film to a flat finish in the chemical mechanical polishing (CMP) process subsequent to the plating process. Any undesirable remaining copper film in the area where fine interconnections are closely spaced tends to cause a short circuit between the interconnections. Thus, the yield of substrates is likely to be lowered.

SUMMARY OF THE INVENTION

It is therefore an object of the present invention to provide a method and apparatus for plating a substrate with copper which can prevent metal copper from being separated out locally on the surface of the substrate, allow a plated copper film to be easily planarized in a chemical mechanical polishing (CMP) process after the plating process, and finish the substrate to a mirror-like glossy surface with a relatively simple facility and a process.

In order to achieve the above object, according to one aspect of the present invention, there is provided a method for plating a substrate with copper, comprising: bringing, at least once, a substrate into contact with a processing solution containing at least one of organic substance and sulfur compound which are contained in a plating solution; and bringing the substrate into contact with the plating solution to plate the substrate.

The substrate is brought into contact with the processing solution before the substrate is plated and/or while the substrate is being plated. The phrase "while the substrate is being plated" means while the plated film is being deposited in a stage before the thickness of the plated film reaches a final target thickness for the plated film.

In the above plating method, before the substrate is plated, the substrate is brought into contact with the processing solution which contains at least one of an organic substance and a sulfur compound which are contained in the plating solution. Alternatively, after the plating solution is removed from the substrate by interrupting plating of the substrate, the substrate is brought into contact with the processing solution.

The substrate may be brought into contact with the processing solution by directly dipping the substrate into the processing solution in a tank, spraying the processing solution over the substrate while the substrate is being rotated in a horizontal plane at a high speed as with a spin dryer, or supplying the processing solution by a pump into a dedicated dipping chamber in which the substrate is set at a predetermined position. When the substrate is thus brought into the processing solution, a thin film of the organic substance and/or the sulfur compound is coated on the processed surface of the substrate. Extra processing solution is preferably removed from the substrate, and then the substrate is plated with copper according to a conventional process. In this manner, metal copper is prevented from being separated out locally on the processed surface of the substrate, and the substrate is plated to provide a mirror-like glossy surface. Further, the size of humps in an area of closely spaced interconnections on the processed surface of the substrate can be suppressed.

Thereafter, it is preferable to remove the processing solution from the substrate and/or to dry the substrate to minimize any amount of processing solution carried into the plating solution to maintain a better quality of the plating solution. However, since the amount of processing solution which is coated is usually much smaller than the amount of plating solution, removing the processing solution from the substrate and/or drying of the substrate are not necessarily required. The processing solution may be removed from the substrate by simply lowering the level of processing solution, lifting the substrate out of the processing solution, rotating the substrate to spin off the processing solution from the substrate as with a spin dryer, rotating the substrate and applying a nitrogen gas blow to the substrate, or passing the substrate through a forced air flow such as an air blower. Further, the two processes including removing of the processing solution and drying of the substrate may be performed successively by one apparatus. For example, the processing solution may be sprayed over the substrate while the substrate is being rotated by a spin cleaner/dryer or the like. This method allows the substrate to contact the processing solution and also allows the processing solution to be removed from the substrate.

The processing solution may be continuously removed from the substrate until the substrate is dried to a certain extent for thereby further minimizing the amount of processing solution carried into the plating solution. In this case, it is preferable to dry the substrate to a partly dried state with a certain moisture content, rather than fully drying the substrate.

The mechanism of the present invention, though it is not fully elucidated, is as follows. The organic substance used in the present invention, which is contained in the plating solution, is known to be effective in offering surface activity and suppressing the separating-out of copper for uniform electrodepositability. The sulfur compound, which is contained in the plating solution, is known to be effective in increasing the separating-out of copper to make the crystal of the separated-out film fine for thereby increasing the glossy level of the plated film. By coating a thin layer of the organic substance and/or the sulfur compound on the processed surface of the substrate in advance and/or while the substrate is being plated, the separating-out of copper over the substrate in its entirety is uniformly accelerated or suppressed, and any abnormal separating-out of copper is prevented. This effect remains the same after the substrate is dried to a certain extent.

Moreover, the organic substance or the sulfur compound in the plating solution is effective to increase wettability between the plating solution and the processed surface of the substrate. Even after the substrate is dried to a certain extent, this effect of the organic substance or the sulfur compound remains the same because the organic substance or the sulfur compound is eluted into the plating solution. Therefore, wetting between the plating solution and the processed surface of the substrate is improved and made uniform over its entire surface, allowing the entire surface of the substrate to be plated uniformly and efficiently. These advantages lead to an improvement of the embeddability of plated copper into high aspect ratio holes and grooves on the substrate.

The organic substance preferably comprises polyethers in an organic polymer for use in copper plating processes. Experiences in tests conducted by the inventors indicate that the organic substance has a concentration ranging from 10 mg/l to 10 g/l in the processing solution and a molecular weight ranging from 100 to 100,000. The organic substance may be a copolymer or a block polymer such as polyethylene glycol, polypropylene glycol, polyvinyl alcohol, ethoxy-naphthol, propoxy-naphthol, ethoxy-phenol, propoxy-phenol, polyoxyethylene polyoxypropylene block polymer, ethoxy-nonylphenol, carboxymethylcellulose, or polyethylene propylene glycol. The processing solution containing the organic substance is particularly effective as a pre-treatment solution for use prior to the plating process.

The sulfur compound is represented by the following general formula:

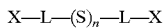

where L represents a lower alkyl group, a lower alkoxy group, a hydroxyl group, or an alkyl group replaceable with a halogen atom and having a carbon number ranging from 1 to 6, x represents a hydrogen atom, an $SO_3M$ group, or a $PO_3M$ group where M indicates a hydrogen atom, an alkaline metal, or an amino group. The processing solution containing the sulfur compound is highly effective to accelerate the separating-out of copper in fine interconnections and suppress humps on the substrate. It is particularly effective that the sulfur compound has a concentration ranging from 0.1 $\mu$mol/l to 70 $\mu$mol/l in the processing solution.

The substrate and the processing solution may be held in contact with each other for a period of time sufficient to cause the processing solution to contact the entire surface of the substrate. If the period of time were too long, the current supplying layer (seed layer) would be chemically damaged. Usually, the period of time is selected in the range from 3 to 60 seconds. If the processing solution is strongly alkaline, then the hydrolysis of the organic substance and the sulfur compound tends to progress. If the acidity of the processing solution is too strong, then the copper of the seed layer is liable to be etched. For this reason, the pH of the processing solution is preferably in the range of 2 to 9. Depending on the type of plating apparatus used, a dried or partly dried substrate may be needed. In such a case, the above effect is unchanged even if the substrate is dried after the substrate and the processing solution are brought into contact with each other.

The method may further comprise etching the plated film at least once by interrupting plating of the substrate while the substrate is being plated, and the substrate is brought into contact with the plating solution again to plate the substrate after the plated film is etched. If the plated film is etched by interrupting plating of the substrate while the substrate is being plated, then the plated film may be etched by an electrolytic etching process in which the current is passed in a direction opposite to the direction in normal plating, or a chemical etching process in which sulfuric acid is employed. Further, after the etching process, the process for bringing, at least once, the substrate into contact with the processing solution may be performed, and then the substrate may be brought into contact with the plating solution again to plate the substrate.

The current supplied in the electrolytic etching process may be a direct current or a pulsed current (so-called PR pulse). The etched depth is proportional to the supplied amount of current (the product of the magnitude of the current and the time in which the current is passed). The current is supplied to the substrate at a current density ranging from 1 to 30 mA/cm² for a period of time ranging from about 0.5 to 30 seconds. The concentration of sulfuric acid employed in the chemical etching process is preferably in the range of about 0.5 to 30%, and the substrate is held in the sulfuric acid for a period of time ranging from about 1 to 30 seconds. The sulfuric acid is a most popular additive added to the plating solution, and can easily be handled from the standpoint of the composition management of the plating solution. The thickness of the plated film that is etched away is 1 nm or more for achieving any appreciable effect of the etching process, and is preferably in the range of about 10 to 50 nm.

According to another aspect of the present invention, there is provided an apparatus for plating a substrate with copper, comprising: a device for bringing a substrate into contact with a processing solution containing at least one of an organic substance and a sulfur compound contained in a plating solution; and a device for bringing the substrate into contact with the plating solution to plate the substrate.

According to still another aspect of the present invention, there is also provided an apparatus for plating a substrate with copper, comprising: a device for bringing a substrate into contact with a processing solution containing at least one of an organic substance and a sulfur compound contained in a plating solution; a device for bringing the substrate into contact with the plating solution to plate the substrate; and a device for etching a plated film deposited on the substrate.

A processing tank for bringing the substrate into contact with the processing solution therein may be separate from a plating tank for plating the substrate, or one common tank may be used instead of these two tanks. If the two tanks are separately employed, then these tanks may be positioned closely to each other, with a delivery unit provided for quickly delivering substrates to the tanks. If one common tank is employed, then the tank may be combined with supply passages for individually supplying the processing solution and the plating solution, and drain passages for changing the solutions. The apparatus may further comprise a device for spraying the processing solution over the substrate while the substrate is being rotated, thereby to bring the processing solution into contact with the substrate. Therefore, the rotational speed of the substrate is increased to remove the processing solution from the substrate and/or to dry the substrate.

The apparatus may further include, in addition to the processing tank and the plating tank, a loading and/or unloading unit for loading and/or unloading substrates, a transferring device for transferring substrates, a cleaning unit for cleaning substrates, and a drying unit for drying substrates, so that substrates can be loaded and unloaded in a clean condition.

The above and other objects, features, and advantages of the present invention will become apparent from the following description when taken in conjunction with the accompanying drawings which illustrates preferred embodiments of the present invention by way of example.

BRIEF DESCRIPTION OF THE DRAWINGS

FIG. 1 is a schematic plan view of a plating apparatus according to an embodiment of the present invention;

DETAILED DESCRIPTION OF THE INVENTION

Figure 2:
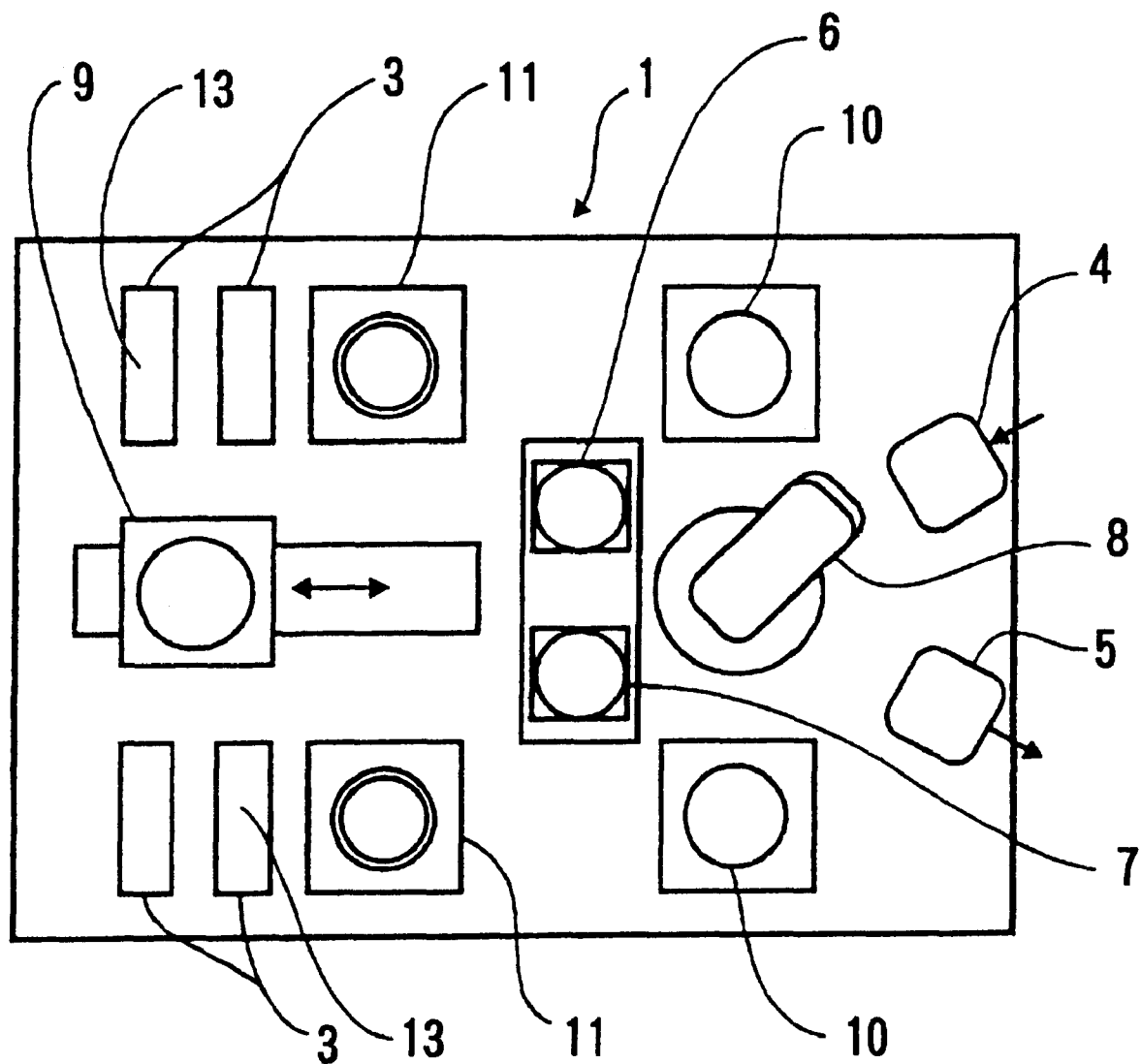
FIG. 2 is a schematic plan view of a plating apparatus according to another embodiment of the present invention.

Next, a method and apparatus for plating a substrate with copper according to an embodiment of the present invention will be described below with reference to FIG. 1.

As shown in FIG. 1, a plating apparatus I comprises a loading unit 4 and an unloading unit for loading and unloading wafer cassettes (not shown) housing substrates (not shown) such as semiconductor wafers to be processed, a delivery arm 8 and a movable delivery arm 9 for delivering substrates one at a time, a pair of coating tanks. (processing tanks) 2 for processing the surface of a substrate with a processing solution, a plurality of plating tanks 3 for plating substrates, a cleaning unit 6 for cleaning substrates, and a pair of rinsing and drying units 10 for rinsing and drying substrates. Each of the coating tanks 2 and the plating tanks 3 may be a batch-type tank for processing a plurality of substrates simultaneously, or may be an individual processing tank for processing substrates individually one at a time. Further, each of the coating tanks 2 and the plating tanks 3 may be a dip-type tank for steadily holding a plating solution or a processing solution, or a tank for being supplied with and discharging a plating solution or a processing solution each time a plurality of substrates or a substrate is processed. The delivery arm 8 is used to handle clean substrates, and the movable delivery arm 9 is used to deliver substrates to be plated or processed.

A process of plating a substrate (not shown) with the plating apparatus 1 shown in FIG. 1 will be described below with respect to a processing flow for one of the substrates. First, a wafer cassette housing, where the substrates are put in, is set in the loading unit 4. Then, the delivery arm 8 takes out a substrate from the wafer cassette, and transfers the substrate to a loading stage 7. The movable delivery arm 9 receives the substrate from the loading stage 7, and places the substrate into one of the coating tanks 2 which hold a processing solution 12a containing at least one of an organic substance and a sulfur compound contained in a copper plating solution. After the substrate is pre-treated by being dipped in the processing solution 12a for a certain period of time, the processed substrate is removed from the coating tank 2 by the movable delivery arm 9, and then placed into one of the plating tanks 3 holding a plating solution 13. In the plating tank 3, the substrate is electrically plated with copper.

If the size of a hump on the substrate needs to be suppressed, then the electric current supplied to the plating tank 3 is stopped to interrupt the copper plating process before the deposited copper film reaches a desired film thickness in the plating tank 3. When the deposited copper film is to be electrolytically etched at this time, then the copper plating process is interrupted, and the electric current is passed in a direction opposite to the direction in which it was passed in the copper plating process. A desired current quantity, which is represented by the product of the magnitude of the current and the amount of time during which the current is passed, is given to etch the deposited copper film.

Thereafter, if necessary, the substrate is removed from the plating tank 3 by the movable delivery arm 9, and placed into the other coating tank 2 which holds a coating solution 12b containing at least one of an organic substance and a sulfur compound contained in a copper plating solution. The substrate is coated by dipping the substrate in the coating solution 12b for a predetermined period of time. In this case, if the processing solutions 12a, 12b have the same composition, then only one of the coating tanks 2 may be used to process and coat the substrate. Thereafter, the movable delivery arm 9 removes the coated substrate from the coating tank 2, and places the substrate into one of the plating tanks 3 holding the plating solution 13 for electrically plating the substrate with copper for a remaining film thickness.

After the completion of the plating process, the movable delivery arm 9 removes the plated substrate from the plating tank 3, and places the substrate on the cleaning unit 6 where the substrate is cleaned in a primary cleaning stage. Then, the delivery arm 8 removes the substrate from the cleaning unit 6 and transfers the substrate to the rinsing and drying unit 10 where the substrate is cleaned in a secondary cleaning stage and then dried. The dried substrate is transferred from the rinsing and drying unit 10 to the wafer cassette in the unloading unit 5 by the delivery arm 8. The substrates in the wafer cassette are then unloaded as clean plated substrates, and sent to the next process such as a CMP process. The plating apparatus 1 has a plurality of coating tanks 2 and a plurality of plating tanks 3, and the delivery arm 8 and the movable delivery arm 9 are controlled and programmed to process substrates successively and efficiently in the coating tanks 2 and the plating tanks 3. Therefore, the plating apparatus 1 has a high operating efficiency.

FIG. 2 shows a plating apparatus 1 according to another embodiment of the present invention. The plating apparatus 1 shown in FIG. 2 is essentially the same as the plating apparatus 1 shown in FIG. 1 except that rotary processing units 11 are employed to process substrates. Each of the rotary processing units 11 comprises a holder mechanism for rotating a substrate, and a spray nozzle for spraying a processing solution over the surface of the substrate. The processing solution sprayed from the spray nozzle onto the substrate can be spread uniformly over the surface of the substrate when the substrate is rotated. After the supply of the processing solution is stopped, the substrate is rotated at an increased speed to remove excess processing solution from the substrate and to dry the substrate in a continuous manner. Therefore, the surface of the substrate can be uniformly coated efficiently with the processing solution, dried, and plated with a desired film of copper.

Figure 3:
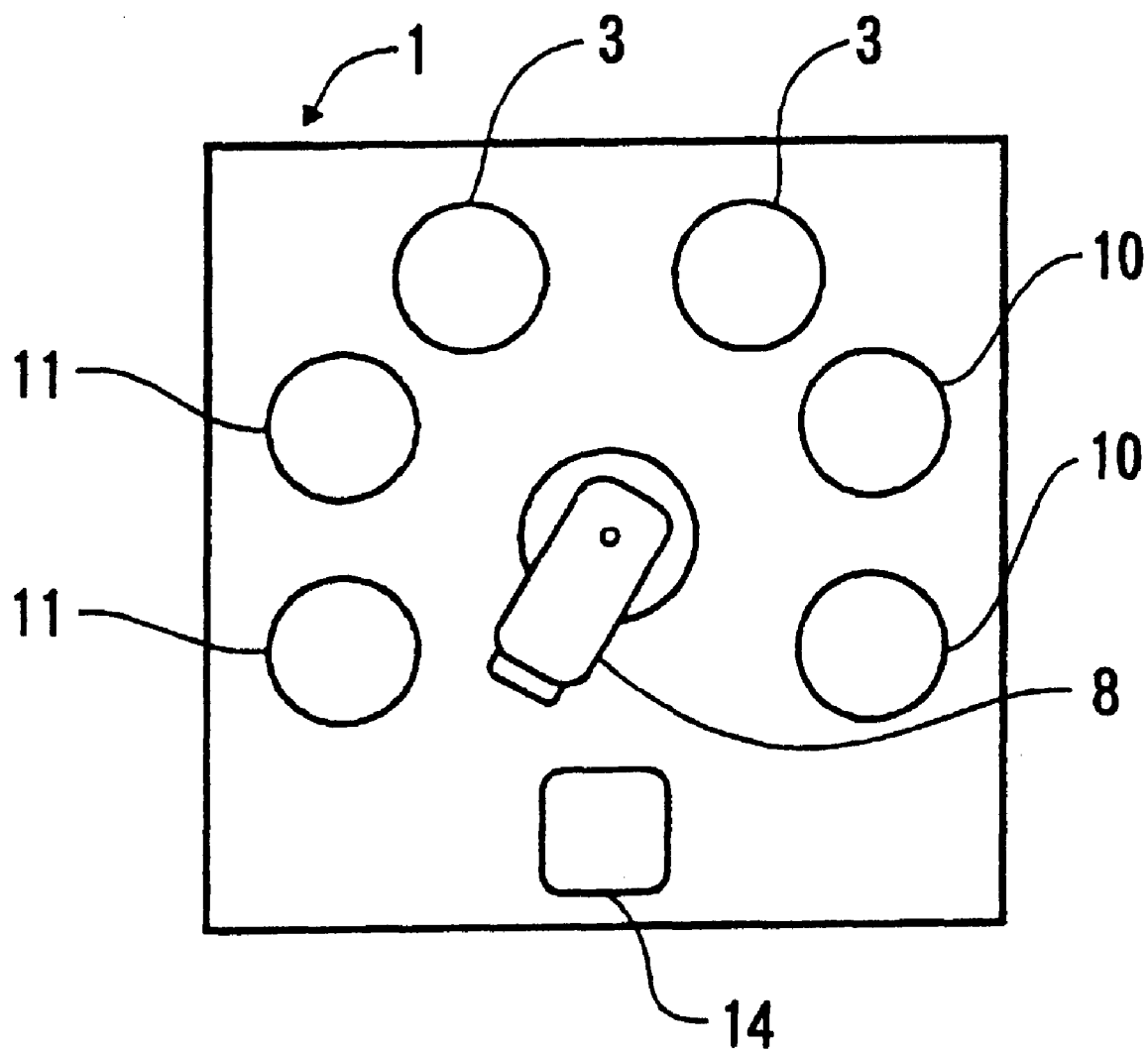
FIG. 3 is a schematic plan view of a plating apparatus according to still another embodiment of the present invention.

FIG. 3 shows a plating apparatus 1 according to still another embodiment of the present invention. The plating apparatus 1 shown in FIG. 3 has substantially the same structure as the plating apparatus shown in FIG. 2, and has a plurality of processing tanks 3, 10, 11 and a single loading and unloading unit 14 for loading and unloading substrates, which are disposed around a single delivery arm 8. The delivery arm 8 delivers substrates to and from the processing tanks 3, 10, 11 and the loading and unloading unit 14. The layout of the processing tanks 3, 10, 11 and the loading and unloading unit 14 disposed around the delivery arm 8 can reduce an installation space of the plating apparatus. The plating apparatus 1 shown in FIG. 3 is capable of depositing a desired layer of copper on a substrate and discharging it as a clean plated substrate therefrom, as with the plating apparatus 1 according to the previous embodiments.

Examples of the plating process carried out by the above plating apparatus will be described below.

EXAMPLE 1

Example 1 had the following processing conditions:
(1) Processing Solution:
 1) Polypropylene glycol (PPG, molecular weight: 400, concentration: 10 mg/l and 5 g/l);
 2) Polyethylene glycol (PEG, molecular weight: 20,000, concentration: 100 mg/l and 10 g/l);
 3) Mixed solution of 1) and 2) (PPG: molecular weight: 700, concentration: 50 mg/l, PEG: molecular weight: 6,000, concentration: 50 mg/l).

(2) Substrate Used:

After a thermal oxide film was deposited to a thickness of 100 nm on an 8-inch silicon substrate, a p-SiN film was deposited as an etching stopper to a thickness of 50 nm on the thermal oxide film. Thereafter, a TEOS oxide film was deposited to a thickness of 600 nm on the p-SiN film. On the substrate, a TaN film having a thickness of 20 nm was deposited as a barrier metal for copper interconnections by reactive sputtering, after which a seed layer having a thickness of 150 nm for copper plating was continuously deposited without breaking the vacuum by an LTS (long-throw sputtering) process.

(3) Processing Time:

The substrate was dipped in the processing solution for 10 seconds.

(4) Drying Process:

Spin dryer (Rotational speed: 3,000/min.×30 seconds, no nitrogen gas blow)

(5) Test Results:

Five substrates processed by the above processing solutions containing organic substances and an unprocessed substrate (comparative example) were plated in an individual processing dip-type plating tank 3. The plating solution was a copper plating solution composed mainly of copper sulfate, and the plated copper film had a thickness of 500 nm. Appearances and CMP characteristics of the plated examples are shown in Table 1 below.

TABLE 1

| | Organic substances | Concentration | Appearance | CMP characteristics |
|---|---|---|---|---|
| Run-1 | PPG | 10 mg/l | Mirror finish, glossy | Good |
| Run-2 | PPG | 5 g/l | Mirror finish, glossy | Good |
| Run-3 | PEG | 100 mg/l | Mirror finish, glossy | Good |
| Run-4 | PEG | 10 g/l | Mirror finish, glossy | Good |
| Run-5 | PEG + PPG | Total: 100 mg/l | Mirror finish, glossy | Good |
| Run-6 | None (Comparative example) | None | Stained | Bad (lack of interconnections) |

Furthermore, the Cu concentration on the back of the substrates was measured as reference data.

The measured Cu concentration of the unprocessed substrate was $5 \times 10^{12}$ atm/cm$^2$, whereas the measured Cu concentration of each of the processed substrates was $5 \times 10^{11}$ atm/cm$^2$ or lower. This result indicates that the present invention is effective to reduce copper contamination on the back of the substrate.

The present example was also found effective to prevent a portion of the current supplying layer where the copper film is very thin from being dissolved, resulting in the promotion of the separation of copper as a plated layer. The reason for this effect appears to be that the polymer used in the present invention also functions as an inhibitor for inhibiting the copper of the current supplying layer from being dissolved.

EXAMPLE 2

A substrate was pre-treated by a processing solution containing a sulfur compound contained in a plating solution.

(1) Processing Solution:
   N, N-dimethyldithiocarbamyl propylsulfonic acid (concentration: 30 μmol/l)

(2) Substrate Used:
   After a thermal oxide film was deposited to a thickness of 100 nm on an 8-inch silicon substrate, a p-SiN film was deposited as an etching stopper to a thickness of 50 nm on the thermal oxide film. Thereafter, a TEOS oxide film was deposited to a thickness of 1,000 nm on the p-SiN film. Holes having a diameter of 0.25 μm and an aspect ratio of 4 and holes having a diameter of 0.5 μm and an aspect ratio of 2 were formed in the TEOS oxide film according to an ordinary lithographic process and an oxide film etching process. On the substrate, a TaN film having a thickness of 20 nm was deposited as a barrier metal for copper interconnections by reactive sputtering, after which a seed layer having a thickness of 150 nm for copper plating was continuously deposited without breaking the vacuum by an LTS (long-throw sputtering) process. Thereafter, the substrate was brought into contact with the above processing solution, and then a current was supplied via the copper seed layer to plate the substrate with copper in a plating solution composed mainly of copper sulfate. Another substrate which was not brought into contact with the above processing solution was also plated in the same manner. The plated copper film had a thickness of 600 nm. After the plating process, an embedded state in the holes was observed by observing a cross-section with a SEM (scanning electron microscope).

(3) Processing Time:
   The substrate was dipped in the processing solution for 5 seconds.

(4) Drying Process:
   Spin dryer (Rotational speed: 2,000/min.×30 seconds, no nitrogen gas blow)

(5) Test Results:
   The results are shown in Table 2 below. The holes, which had a diameter of 0.5 μm and an aspect ratio of 2, in the substrates processed by the sulfur compound solution and not processed by the sulfur compound solution exhibited no difference. The hole which had a diameter of 0.25 μm and an aspect ratio of 4 in the substrate processed by the sulfur compound solution was filled without voids, but the hole which had a diameter of 0.25 μm and an aspect ratio of 4 in the substrate not processed by the sulfur compound solution suffered voids in the bottom thereof. The processing based on the sulfur compound solution is considered to accelerate the deposition of plated copper on the bottom of the hole.

TABLE 2

|  | Hole having a diameter of 0.5 μm and an aspect ratio of 2 | Hole having a diameter of 0.25 μm and an aspect ratio of 4 |
|---|---|---|
| Not processed by sulfur compound solution | Large voids at the Bottom of the hole | Small voids at the bottom of the hole |
| Processed by sulfur compound solution | Fully filled | Fully filled |

EXAMPLE 3

A substrate was pre-treated by a processing solution containing an organic substance and a sulfur compound contained in a plating solution.

(1) Processing Solution:
   1) organic substance: Mixed solution of PPG and PEG (PPG: molecular weight: 700, concentration: 50 mg/l, PEG: molecular weight: 6,000, concentration: 50 mg/l).
   2) Sulfur compound: N,N-dimethyldithiocarbamyl propylsulfonic acid (concentration: 70 μmol/l)

(2) Substrate Used:
   After a thermal oxide film was deposited to a thickness of 100 nm on an 8-inch silicon substrate, a p-SiN film was deposited as an etching stopper to a thickness of 50 nm on the thermal oxide film. Thereafter, a TEOS oxide film was deposited to a thickness of 1,000 nm on the p-SiN film. Holes having a diameter of 0.20 μm and an aspect ratio of 5 and holes having a diameter of 0.30 μm and an aspect ratio of 4 were formed in the TEOS oxide film according to an ordinary lithographic process and an oxide film etching process. On the substrate, a TaN film having a thickness of 20 nm was deposited as a barrier metal for copper interconnections by reactive sputtering, after which a seed layer having a thickness of 150 nm for copper plating was continuously deposited without breaking the vacuum by an LTS (long-throw sputtering) process. Thereafter, the substrate was brought into contact with the above processing solution, and then a current was supplied via the copper seed layer to plate the substrate with copper in a plating solution composed mainly of copper sulfate. Another substrate which was not brought into contact with the above processing solution was also plated in the same manner. The plated copper film had a thickness of 600 nm. After the plating process, an embedded state in the holes was observed by observing a cross-section with a SEM (scanning electron microscope).

(3) Processing Time:
   The substrate was rotated at a rotational speed of 150 μm by alspin dryer and the solution was supplied at a rate of 10 ml/second.

(4) Drying Process:
   Spin dryer (Rotational speed: 2,000/min.×30 seconds, no nitrogen gas blow)

(5) Test Results:
   The results are shown in Table 3 below. The holes, which had a diameter of 0.30 μm and an aspect ratio of 4, in the substrates processed by the sulfur compound solution and not processed by the sulfur compound solution exhibited no difference. The hole which had a diameter of 0.20 μm and an aspect ratio of 5 in the substrate processed by the sulfur compound solution was filled without voids, but the hole which had a diameter of 0.20 μm and an aspect ratio of 5 in the substrate not processed by the sulfur compound solution suffered voids in the bottom thereof. The organic substance is considered to have increased the wettability and the uniform electrodepositability in the holes, and the processing based on the sulfur compound solution is considered to accelerate the deposition of plated copper on the bottom of the hole.

TABLE 3

|  | Hole having a diameter of 0.20 μm and an aspect ratio of 5 | Hole having a diameter of 0.30 μm and an aspect ratio of 4 |
|---|---|---|
| Not processed by organic substance and sulfur compound solution | Large voids at the bottom of the hole | Small voids at the bottom of the hole |
| Processed by organic | Fully filled | Fully filled |

TABLE 3-continued

|  | Hole having a diameter of 0.20 μm and an aspect ratio of 5 | Hole having a diameter of 0.30 μm and an aspect ratio of 4 |
|---|---|---|
| substance and sulfur compound solution |  |  |

EXAMPLE 4

While a substrate was being plated with copper, the surface of the plated copper film was brought into contact with a processing solution containing a sulfur compound contained in a copper plating solution, or the surface of the plated film was etched.

(1) Substrate Used:

After a thermal oxide film was deposited to a thickness of 100 nm on an 8-inch silicon substrate, a p-SiN film was deposited as an etching stopper to a thickness of 50 nm on the thermal oxide film. Thereafter, a TEOS oxide film was deposited to a thickness of 1,000 nm on the p-SiN film. A groove pattern having a width of 0.2 μm with 0.2 μm wide space and an aspect ratio of 3 was formed in the TEOS oxide film according to an ordinary lithographic process and an oxide film etching process. On the substrate, a TaN film having a thickness of 20 nm was deposited as a barrier metal for copper interconnections by reactive sputtering, after which a seed layer having a thickness of 150 nm for copper plating was continuously deposited without breaking the vacuum by an LTS (long-throw sputtering) process. Thereafter, a current was supplied via the copper seed layer to plate the substrate with copper in a plating solution composed mainly of copper sulfate. The plated copper film had a thickness of 500 nm (650 nm including the thickness of the copper seed layer).

(2) Processing Instance 1:

The copper plating process was stopped when the plated copper film was deposited to a thickness of 100 nm, and the plating solution was removed from the surface of the plated copper film. Thereafter, the surface of the plated copper film was brought into contact with a processing solution in which a sulfur compound (N, N-dimethyldithiocarbamyl propylsulfonic acid (concentration: 5 mg/l=24 μmol/l)) contained in the plating solution was dissolved. Subsequently, the surface of the plated copper film was brought into contact with the plating solution again, and copper was deposited to a remaining thickness of 400 nm by electroplating.

(3) Processing Instance 2:

The copper plating process was stopped when the plated copper film was deposited to a thickness of 100 nm, and the anode and the cathode for electroplating were switched around and currents corresponding to etched copper film thicknesses of 10 nm (processing instance 2-1), 20 nm (processing instance 2-2), and 330 nm (processing instance 2-3) were supplied. Thereafter, the plating solution was removed from the surface of the plated copper film. The surface of the plated copper film was brought into contact with a processing solution in which a sulfur compound (N, N-dimethyldithiocarbamyl propylsulfonic acid (concentration: 5 mg/l=24 μmol/l)) contained in the plating solution was dissolved. Subsequently, the surface of the plated copper film was brought into contact with the plating solution again, and the anode and the cathode for electroplating were switched around and copper was deposited to a remaining thickness of 400 nm by electroplating.

(4) Processing Instance 3:

The copper plating process was stopped when the plated copper film was deposited to a thickness of 100 nm, and the anode and the cathode for electroplating were switched around and currents corresponding to etched copper film thicknesses of 10 nm (processing instance 3-1), and 30 nm (processing instance 3-2) were supplied. Thereafter, the anode and the cathode for electroplating were switched around and copper was deposited to a remaining thickness of 400 nm by electroplating.

(5) Test Results:

The shapes of the grooves filled by the plated copper films on the substrates thus produced were observed by observing a cross-section with SEM (scanning electron microscope), and the differences (the sizes of humps) between the thicknesses of the plated copper films on the groove patterns and the thicknesses of the plated copper films on large spaces next to the groove patterns were checked. The results are shown in Table 4 below. Table 4 also includes the results of a comparative example in which a plated copper film having a thickness of 1,000 nm was deposited on a substrate.

TABLE 4

|  | Thickness of plated copper film on groove pattern (nm) | Thickness of plated copper film on adjacent space (nm) | Hump size (nm) | Surface gloss |
|---|---|---|---|---|
| Processing instance 1 | 700 | 625 | 75 | Good |
| Processing instance 2-1 (10 nm) | 775 | 650 | 125 | Good |
| Processing instance 2-2 (20 nm) | 725 | 625 | 100 | Good |
| Processing instance 2-3 (30 nm) | 700 | 625 | 75 | Good |
| Processing instance 3-1 (10 nm) | 675 | 625 | 50 | Good |
| Processing instance 3-2 (30 nm) | 700 | 625 | 75 | Good |
| Comparative example | 1000 | 400 | 600 | Bad |

By bringing the surface of the plated copper film once into contact with the processing solution containing the sulfur compound contained in the copper plating solution during the copper plating process or etching the plated copper film, the size of humps which would obstruct the planarization process such as the chemical mechanical polishing (CMP) process after the plating process can be greatly reduced.

In this example, the processing solution contained the sulfur compound contained in the copper plating solution. However, the processing solution may contain an organic substance contained in the copper plating solution.

According to the present invention, as described above, since copper is prevented from being abnormally separated out while a substrate is being plated with copper, the substrate can be plated with a copper film having a uniform thickness while reducing the size of any undesirable humps. Copper can be embedded well for fine interconnections, producing copper interconnections free of defects such as voids. As a result, the plated substrate can subsequently be easily polished by the chemical mechanical polishing process, so that the yield of LSI circuits with copper interconnections can be increased. Therefore, the cost of LSI circuit fabrication can be greatly be lowered. Accordingly, the method and the apparatus for plating a substrate with copper according to the present invention are highly useful and effective in the industry of semiconductor fabrication.

In the above embodiments, although a method and apparatus for plating a substrate with copper have been described, the present invention is applicable to a method and apparatus for plating a substrate with a different metal such as silver or gold.

Although certain preferred embodiments of the present invention have been shown and described in detail, it should be understood that various changes and modifications may be made therein without departing from the scope of the appended claims.

What is claimed is:

1. A method of plating a substrate, comprising:
   bringing a substrate into contact with a processing solution comprising an organic substance which comprises a polyether organic polymer with a molecular weight in the range of 100 to 100,000 and has a concentration range of 10 mg/l to 10 g/l in the processing solution, wherein said bringing of the substrate into contact with the processing solution includes forming a layer of the organic substance on the substrate; and
   bringing the substrate into contact with a plating solution including the organic substance so as to plate the substrate, wherein the plating solution is different in composition form the processing solution.

2. The method of claim 1, wherein the plating solution comprises a copper plating solution for copper plating the substrate.

3. The method of claim 1, wherein the plating solution comprises one of a silver plating solution for silver plating the substrate and a gold plating solution for gold plating the substrate.

4. The method of claim 1, wherein said bringing the substrate into contact with the plating solution so as to plate the substrate comprises bringing the substrate into contact with the plating solution so as to form a plated film having a final target thickness, said bringing the substrate into contact with the processing solution being conducted before the final target thickness of the plated film is obtained.

5. The method of claim 1, wherein said bringing the substrate into contact with the plating solution so as to plate the substrate comprises bringing the substrate into contact with the plating solution so as to form a plated film having a final target thickness, said bringing the substrate into contact with the processing solution being conducted before said bringing the substrate into contact with the plating solution and again being conducted before the final target thickness of the plated film is obtained.

6. The method of claim 1, further comprising performing one of removing excess processing solution from the substrate and drying the substrate after said bringing the substrate into contact with the processing solution and before said bringing the substrate into contact with the plating solution.

7. The method of claim 1, wherein the processing solution further comprises a sulfur compound, and the plating solution further comprises the same sulfur compound.

8. The method of claim 7, wherein the sulfur compound comprises a sulfur compound represented by the following formula:

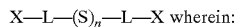

X—L—(S)$_n$—L—X wherein:

L represents one of a lower alkyl group, a lower alkoxy group, a hydroxyl group, and an alkyl group replaceable with halogen and having a carbon number in a range of 1 to 6; and X represents one of hydrogen, an SO$_3$M group, and a PO$_3$M group wherein M indicates one of a hydrogen molecule, an alkaline metal, and an amino group; and wherein the sulfur compound has a concentration in a range of 0.1 μmol/l to 70 μmol/l in the processing solution.

9. The method of claim 1, wherein said bringing the substrate into contact with the processing solution comprises bringing the substrate into contact with the processing solution for a time period in a range of 3 seconds to 60 seconds.

10. The method of claim 1, further comprising:
    interrupting said bringing the substrate into contact with the plating solution after a plated film is formed on the substrate;
    etching the plated film formed on the substrate;
    bringing the substrate having the etched plated film into contact with the processing solution; and
    bringing the substrate into contact with the plating solution so as to continue said plating of the substrate so as to form a film plate having a final target thickness.

11. The method of claim 10, wherein said etching comprises one of electrolytic etching and chemical etching.

12. An apparatus for plating a substrate, comprising:
    a processing device for bringing a substrate into contact with a processing solution comprising an organic substance which comprises a polyether organic polymer with a molecular weight in the range of 100 to 100,000 and has a concentration range of 10 mg/l to 10 g/l in the processing solution, wherein said processing device is operable to form a layer of said organic substance on the substrate by bringing the substrate into contact with said processing solution; and
    a plating device for bringing the substrate into contact with a plating solution including said organic substance so as to plate the substrate, wherein said plating solution is different in composition form said processing solution.

13. The apparatus of claim 12, further comprising a drying-removal device for performing at least one of removing excess processing solution from the substrate and drying the substrate prior to plating the substrate.

* * * * *

UNITED STATES PATENT AND TRADEMARK OFFICE
CERTIFICATE OF CORRECTION

PATENT NO. : 6,638,411 B1
DATED : October 28, 2003
INVENTOR(S) : Koji Mishima et al.

It is certified that error appears in the above-identified patent and that said Letters Patent is hereby corrected as shown below:

Column 13,
Line 28, please replace "composition form the processing solution" with -- composition from the processing solution --.

Column 14,
Line 50, please replace "composition form said processing" with -- composition from said processing --.

Signed and Sealed this

Seventeenth Day of August, 2004

JON W. DUDAS
*Acting Director of the United States Patent and Trademark Office*